United States Patent [19]

Schrantz

[11] Patent Number: 5,008,719

[45] Date of Patent: Apr. 16, 1991

[54] DUAL LAYER SURFACE GATE JFET HAVING ENHANCED GATE-CHANNEL BREAKDOWN VOLTAGE

[75] Inventor: Gregory A. Schrantz, Melbourne, Fla.

[73] Assignee: Harris Corporation, Melbourne, Fla.

[21] Appl. No.: 424,917

[22] Filed: Oct. 20, 1989

[51] Int. Cl.$^5$ .............................. H01L 29/80
[52] U.S. Cl. ........................ 357/22; 357/52; 357/49; 357/20
[58] Field of Search ............ 357/22 D, 22 R, 52, 357/52 D, 20, 22 B, 22 C, 22 G, 22 H, 49

[56] References Cited

U.S. PATENT DOCUMENTS

| 4,496,983 | 1/1985 | Dunkley et al. | 357/22 G |
| 4,816,880 | 3/1989 | Muro | 357/22 G |
| 4,912,053 | 3/1990 | Schrantz | 357/22 G X |

FOREIGN PATENT DOCUMENTS 62-81767  4/1987  Japan ...................... 357/22 R

OTHER PUBLICATIONS

Roach et al., "Sidegating in GaAs Current Limiters," IEEE Transactions on Electron Devices, vol. ED-34, No. 2, Feb. 1987, pp. 181–184.

Primary Examiner—William Mintel
Attorney, Agent, or Firm—Evenson, Wands, Edwards, Lenahan & McKeown

[57] ABSTRACT

Radiation insensitivity and breakdown voltage characteristics of a dual region top gate JFET are improved by a top gate structure in which the entirety of the lower concentration region of the top gate is separated from the oxide/silicon interface by the top surface high impurity concentration region. The dual region top gate extends from the substrate/insulator interface to a channel region beneath the top surface of the JFET substrate and extends laterally to bridge the source and drain regions. The lateral extent of the dual region top gate may be delimited by barrier regions, respectively separating the top gate regions from the source and drain regions. The barrier regions extend from the substrate/oxide interface to the channel and may comprise dielectric material or a combination of dielectric material and doped semiconductor material.

17 Claims, 3 Drawing Sheets

DUAL LAYER SURFACE GATE JFET HAVING ENHANCED GATE-CHANNEL BREAKDOWN VOLTAGE

FIELD OF THE INVENTION

The present invention relates in general to semiconductor devices and is particularly directed to a junction field effect transistor (JFET) having an ion-implanted channel, ion-implanted top gate structure.

BACKGROUND OF THE INVENTION

Ion-implanted junction field effect transistors (hereinafter termed $I^2$JFETs) typically contain a buried (ion-implanted) channel region which bridges respective source and drain regions of the JFET and the conductive properties of which are controlled by modulation of the space-charge region formed with the adjoining top gate and bottom gate regions. The device structure of an exemplary P-channel $I^2$JFET is diagrammatically shown in cross-section in FIG. 1 as comprising a semiconductor (e.g. silicon, gallium arsenide) substrate 10 of N-type conductivity, forming the bottom gate of the device, into a top surface portion of which respective P-type drain and source regions 15 and 16 are formed. Drain and source contact regions 17 and 18 of high impurity concentration P+ material are introduced into the surface 11 to a prescribed depth in the respective source and drain-regions 15 and 16. Overlying the top surface 11 of the substrate 10 is a field oxide layer 25, a relatively thin portion 14 of which lies atop that portion of the substrate into which a top gate region and channel are to be formed. This is shown diagrammatically in FIG. 1 as being disposed between the drain and source regions 15 and 16. Apertures in the field oxide layer 25 are provided for contacting respective drain and source metallizations 23 and 24 to high impurity concentration P+ regions 17 and 18.

The gate/channel structure of the JFET is provided by way of an implanted top gate region 22 of N-type conductivity. Gate region 22 may be formed by implanting suitable N-type conductivity ions, region 22 forming a PN junction 31 with the implanted P material of an underlying channel region 21 and bridging drain region 15 with source region 16. Channel region 21 forms a PN junction 32 with the N material of the substrate. That portion of top gate region 22 which defines a gate-drain PN junction with the P material of drain region 15 is referenced as PN junction 41, an extension of PN junction 31. Also, that portion of top gate region 22 which defines a gate-source PN junction with the P material of source region 16 is referenced as PN junction 42, also an extension of PN junction 31.

In operation, the channel region 21 is normally conductive, so as to provide a current path between the drain and source regions 15 and 16, respectively. In response to the application of a reverse-biasing gate voltage to the top gate 22 and bottom gate (substrate 10), majority charge carriers are depleted from the channel 21. As the space-charge regions extend into the channel, the channel resistance increases, thereby reducing the current between the drain and the source. The top gate is typically tied to the bottom gate with a suitable high impurity concentration (N+) diffused region (not shown).

The breakdown voltage, $BV_S$ (drain shorted to source), of an ion-implanted PJFET has been experimentally determined to be modulated by the linear junction gradient of the top gate to channel junction 31. Specifically, junction 31 has a linear grading constant which is a function of top gate implant dosage and implant energy, as well as channel dosage and implant energy. Maintaining a high surface concentration at the top gate/oxide interface 11 limits the freedom to minimize the grading constant of the junction.

One solution to this problem, described in my U.S. Pat. No. 4,683,485, issued July 28, 1987, entitled Technique for Increasing Gate-Drain Breakdown Voltage of Ion-Implanted JFET, assigned to the assignee of the present application, and diagrammatically illustrated in FIG. 2, is to incorporate a high impurity concentration region 62 within top gate region 61 (which has impurity concentration lower than that of region 62). Region 62 is physically separated from source and drain regions 15 and 16 by surface portions 66 and 67 of top gate region 61. Now, although such an improved JFET configuration addresses the condition where the JFET breakdown is limited by the junction gradient of regions 61/15 and/or 61/16, it has been found that such a structure is prone to hot electron degradation at surface portions 66 and 67 of region 61 with oxide/silicon interface 11.

More particularly, in NJFETs implemented with the structure of FIG. 2, the low surface concentration of top gate region 61 (which, in this case, is p-type) tends to facilitate inversion at the surface, due to ionizing radiation-induced positive fixed charge build-up in the oxide layer 14. Such an inversion layer results in a low breakdown voltage and high reverse leakage current.

SUMMARY OF THE INVENTION

In accordance with the present invention, the radiation insensitivity and breakdown voltage characteristics of the above described patented device are improved by configuring the dual top gate structure such that the entirety of the lower concentration region of the top gate is separated from the oxide/silicon interface by the high impurity concentration region. More particularly, the present invention is directed to an $I^2$JFET structure in which a dual region top gate extends from the substrate/insulator interface to a channel region that is disposed beneath the top surface of the JFET substrate and extends laterally to bridge the source and drain regions. Within the dual top gate a first, top surface, region of a relatively high impurity concentration extends from the top surface interface to a second, channel-contiguous semiconductor region of a relatively low impurity concentration, such that the entirety of the second region of the top gate is spaced apart from the substrate/oxide interface by the first region. The implant dosage and energy of the second region have a peak concentration that is less than or equal to the peak concentration of the channel. In addition, the energy of the implant for the second region is chosen to minimize the linear grading constant of the PN junction between the second region and channel. The choice of implant dosage and energy for the second region simultaneously provides maximum breakdown voltage for the gate-channel junction and minimum variation in pinch-off voltage resulting from energy variations in the second region and the adjacent channel. The surface concentration of the first, top surface, region is chosen to maximize hot electron immunity and radiation hardness within the constraint of the gate-drain breakdown voltage.

In accordance with a first embodiment of the invention, each of the first and second regions of the top gate overlaps the source and drain regions, which contain high impurity electrode contact regions. To prevent the possibility of a reach-through breakdown from the first region to the high impurity source and drain contact regions, the first region may be separated from the contact regions by a distance greater than the separation between the second region and the contact regions.

In accordance with a second embodiment of the invention, the lateral extent of the dual region top gate is delimited by first and second barrier regions, respectively separating each of the first and second regions of the top gate from each of the source and drain regions. The barrier regions extend from the substrate/oxide interface to the channel and may comprise dielectric material or a combination of dielectric material and doped semiconductor material.

To prevent the formation of an inversion layer within the second region of the top gate at its interface with the barrier regions when the drain is reverse biased relative to the gate, the second embodiment may contain modified barrier regions which contain thin walled oxide tubs filled with highly doped polycrystalline silicon regions that extend to the surface of the substrate and may be biased independently to minimize the influence of the drain bias on the sidewalls of regions adjacent to the barrier oxides. In addition, beneath the barrier regions, respective impurity channel stopper regions may be disposed. These more heavily doped (p+ in the case of an PJFET) stopper regions minimize the influence of radiation-induced fixed oxide charge on the more lightly doped p channel 81. In the worst case they prevent inversion.

BRIEF DESCRIPTION OF THE DRAWINGS

FIG. 4 depicts the as-implanted profile of the JFET of FIG. 3, while

DETAILED DESCRIPTION

As pointed out briefly above, the present invention provides a dual region top gate JFET structure in which the entirety of the lower concentration region of the top gate is separated from the oxide/silicon interface by a high impurity concentration region. The doping parameters employed result in a maximum breakdown voltage for the gate-channel junction and a minimum variation in pinch-off voltage resulting from energy variations in the second region and the adjacent channel. In addition, hot electron immunity and radiation hardness within the constraint of the gate-drain breakdown voltage are enhanced.

Figure 1:
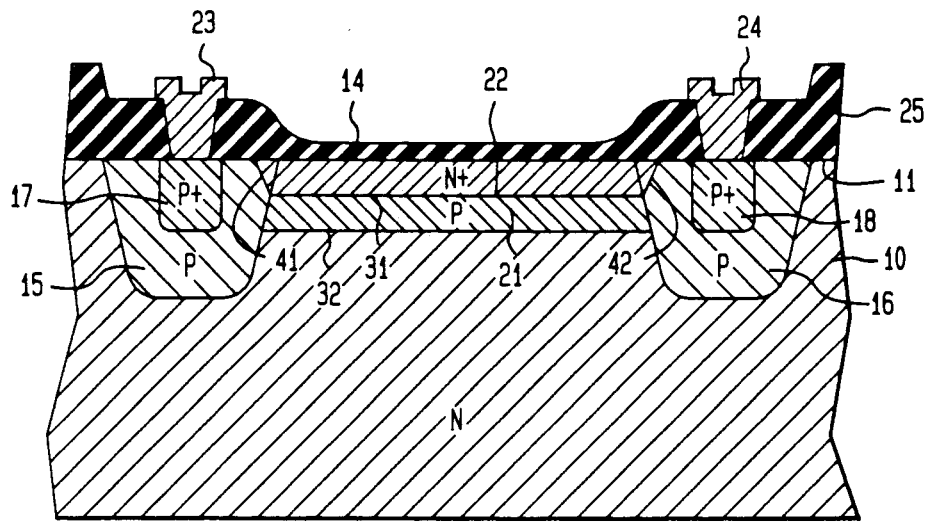
FIG. 1 is a diagrammatic cross-sectional illustration of a conventional ion-implanted P-channel junction field effect transistor having a single implant top gate.
Figure 2:
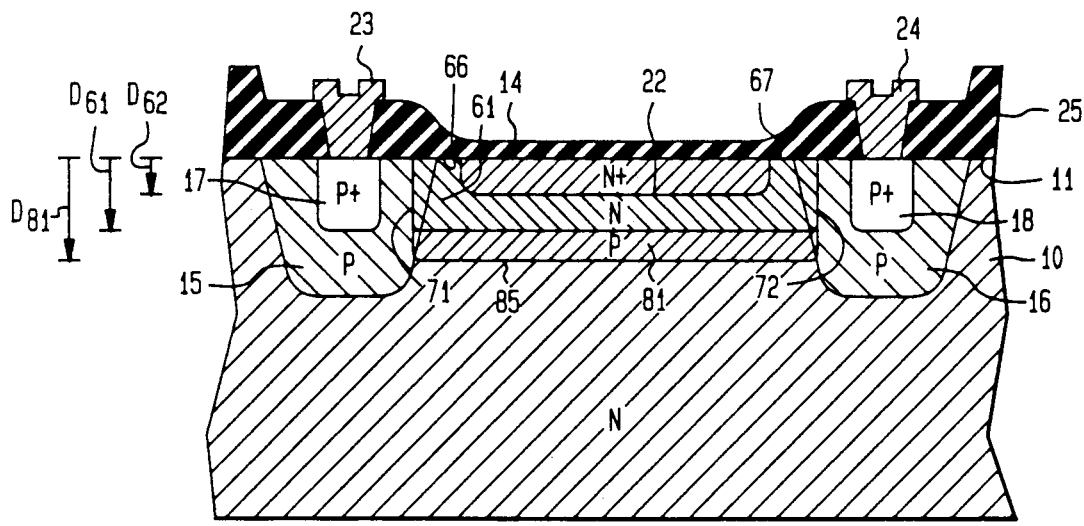
FIG. 2 is a diagrammatic cross-sectional illustration of an ion-implanted P-channel junction field effect transistor having a dual implant top gate described in U.S. Pat. No. 4,683,485.
Figure 3:
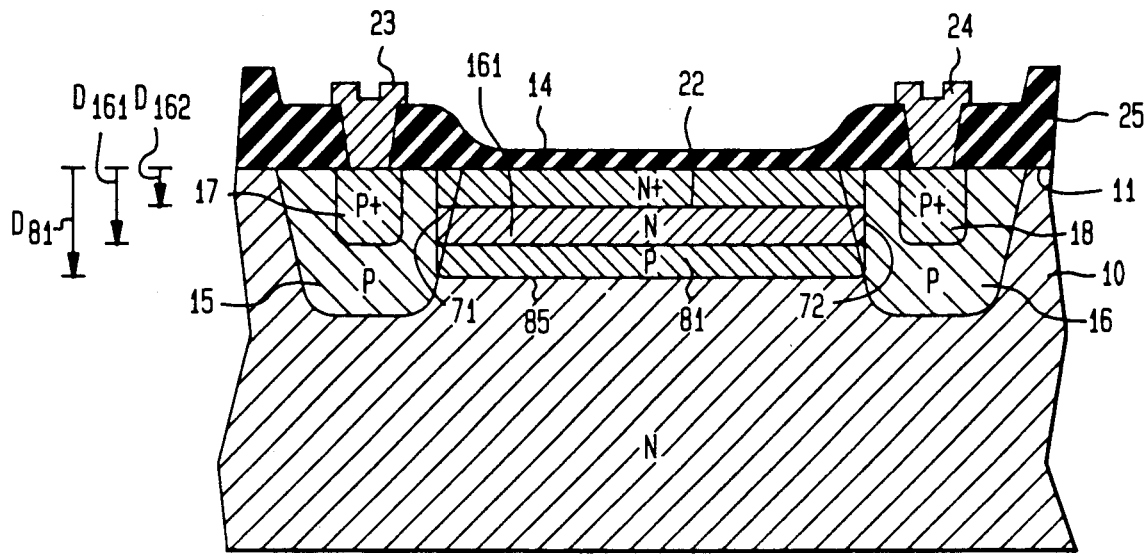
FIG. 3 diagrammatically illustrates a dual region top gate JFET in accordance a first embodiment of the present invention.

Pursuant to a first embodiment of the improved dual region top gate JFET in accordance with the present invention, diagrammatically illustrated in FIG. 3 for a P channel device, the lateral extent of high impurity concentration N+ surface region 62 of the dual top gate configuration of the patented structure of FIG. 2 is increased to define a region 162 which covers the entire lateral extent of N region 161, thereby effectively separating the entirety of region 161 from oxide/semiconductor interface 11. In accordance with this embodiment, the dual region top gate is formed by implanting a low impurity concentration region 161 into the top surface 11 of the body 10 using a masking photoresist layer in which a suitable window has been formed, the masking layer overlying field oxide region 25 and exposing portions of each of regions 15 and 16.

Prior to the dual top gate implant, a channel region 81 is implanted in the substrate to a depth $D_{81}$, forming a PN junction 85 with the substrate 10. The same masking photoresist layer may be used for both the channel implanted region 81 and the low impurity concentration top gate region. Substrate 10 may comprise an N-type conductivity substrate into which P-type conductivity ions are implanted through an aperture in the first mask to a depth $D_{81}$ of 0.15 to 0.9 micron forming a P-type channel 81 having an impurity concentration on the order of from $5 \times 10^{15}$ to $1 \times 10^{18}$/cm$^3$. This implantation is then followed by the dual implant of the low concentration region 161 and the high concentration region 162. For an exemplary P-channel device formed in an N-substrate, discussed above with reference to FIG. 2, region 161 may be formed by an N-type implant (e.g. phosphorus) so as to obtain a low impurity concentration (e.g. in a range of from $5 \times 10^{15}$ to $5 \times 10^{17}$/cm$^3$). The depth $D_{161}$ of this first top gate region 161 implanted through thin (0.05 to 0.15 micron) oxide portion 14 of field oxide 25 may be on the order of 0.05 to 0.4 microns. A PN junction 171, formed between region 161 and drain region 15, is defined by the extent of the window in the photo resist mask and the depth $D_{161}$ of the implanted region 161. A second, high impurity concentration region 162 is implanted in region 161, through the use of a further masking layer, having a smaller aperture or implant window than the masking layer provided for the low impurity concentration region 161. After formation of the second masking layer, a second implant of N-type impurities (e.g. phosphorus) is carried out, resulting in the formation of a relatively shallow high impurity concentration (e.g. in a range of from $1 \times 10^{16}$ to $5 \times 10^{18}$/cm$^3$) region 162, which extends to a depth $D_{162}$ from the surface 11 of the substrate 10 into the first region 161 and overlaps regions 15 and 16. The depth $D_{162}$ the second region 162 may be on the order of 0.03 to 0.35 microns. Because the impurity concentration of region 162 is substantially higher than that of region 161, region 162 effectively makes up for the lack of charge carriers available from region 161 when the device is biased near pinch-off, thereby preventing the top gate structure from being fully depleted of charged carriers.

Figure 4:
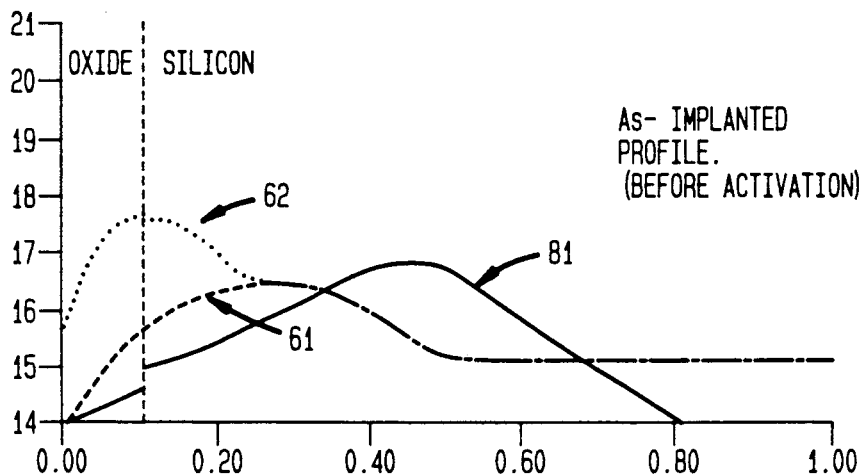
Figure 5:
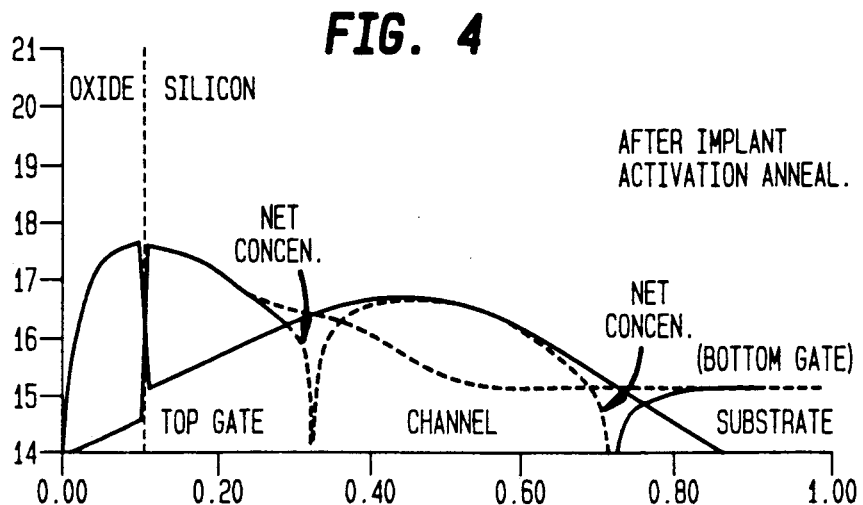
FIG. 5 illustrates the net concentration after implant activation.

As pointed out above, in the embodiment of the invention shown in FIG. 3, the dual top gate structure (regions 161 and 162) is configured such that the entirety of lower concentration region 161 is separated from oxide/silicon interface 11 by high impurity concentration region 162. In addition, the implant dosage and energy of region 161 have a peak concentration that is less than or equal to the peak concentration of the channel. In addition, the energy of the implant for region 161 is chosen to minimize the linear grading constant of the PN junction between the second region and channel. The choice of implant dosage and energy for the second region simultaneously provides maximum breakdown voltage for the gate-channel junction and minimum variation in pinch-off voltage resulting from energy variations in region 161 and the adjacent channel 81. The surface concentration of top surface region 162 is chosen to maximize hot electron immunity and radiation hardness within the constraint of the gate-drain breakdown voltage. The as-implanted profile is illustrated in FIG. 4; after implant activation the net concentration has the characteristic shown in FIG. 5.

In the cross-sectional illustration of the first embodiment of the invention shown in FIG. 3, regions 161 and 162 of the top gate and channel region 81 are end-wise coincident or line-on-line where they overlap source and drain regions 15 and 16. To prevent the possibility of a reach-through breakdown from region 162 to the high impurity source and drain contact regions 17 and 18, region 162 may be separated from the contact regions by a distance greater than the separation between region 161 and the contact regions. Alternatively, this potential reach-through phenomenon may be effectively prevented by a second embodiment of the invention diagrammatically illustrated in cross-section in FIG. 6.

More particularly, the lateral extent of each of regions 161 and 162 of the dual region top gate is delimited by first and second barrier regions 126 and 127, which respectively separate regions 161 and 162 from source and drain regions 15 and 16, and extend from substrate/oxide interface 11 to channel region 81. As isolation barriers each of regions 126 and 127 may contain a densified dielectric material, such as silicon dioxide, or a combination of dielectric material and doped semiconductor material. Barrier regions 126 and 127 may be formed by a suitable trench etch (e.g. reactive ion etch) followed by a dielectric refill, either prior or subsequent to implanting regions 161 and 162. The formation of the barrier regions through a trench/refill process provides several advantages over conventional processing techniques for forming dielectric isolation, such as LOCOS oxide extensions in silicon-on-insulator structures, as described, for example in an article by H. K. Choi et al, entitled: "Radiation-Hardened Silicon-on-Insulator Junction Field-Effect Transistors Fabricated by a Self-Aligned Process", IEEE Electron Device Letters, Vol. EDL-8, NO. 3, March 1987, pp 101+.

More particularly, a LOCOS process requires that source and drain extensions be implanted prior to the formation of the LOCOS regions. As the LOCOS regions are not self-aligned to the extensions, the resulting channel length is prone to misalignment-induced variation. In accordance with the present invention, on the other hand, this problem is overcome since the entire structure c,f the JFET (i.e. implanted source and drain, source and drain extensions, channel, top gate and surface gate) can be self-aligned to the trenches. The use of trenches to form the barrier regions also avoids the stress that is induced by a LOCOS process, thereby reducing stress-related device effects on junction leakage, ideality factor, pinch-off voltage, channel mobility and subthreshold current.

Figure 6:
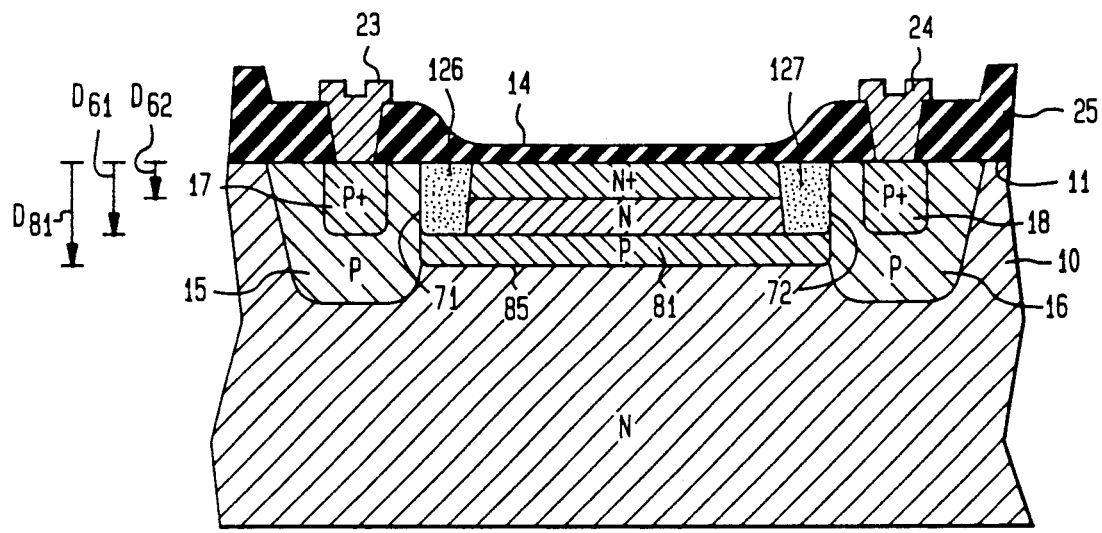
FIG. 6 diagrammatically illustrates a dual region top gate JFET in accordance a second embodiment of the present invention.
Figure 7:
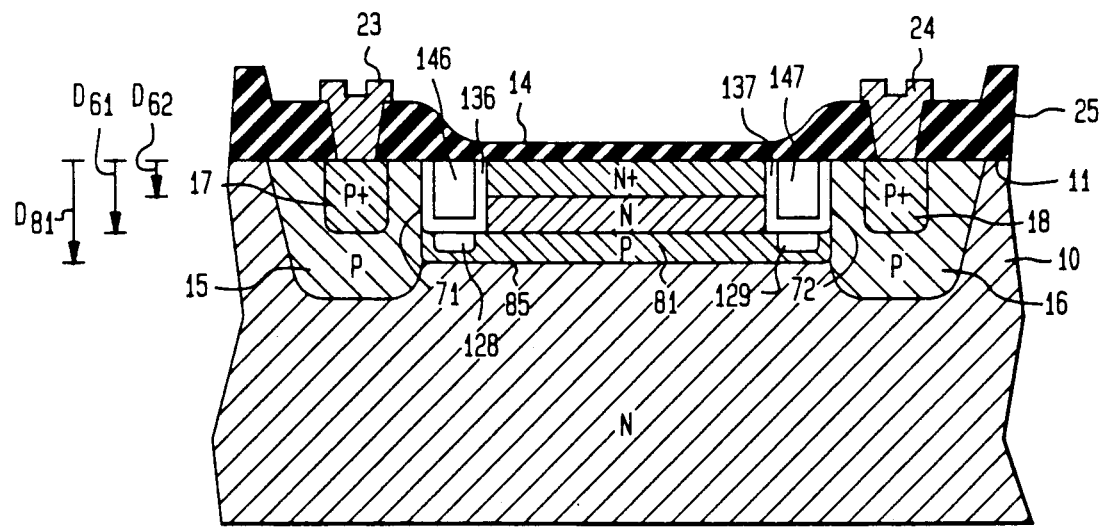
FIG. 7 diagrammatically illustrates a modification of the JFET configuration shown in FIG. 6.

To prevent the formation of an inversion layer within region 161 at its interface with barrier regions 126 and 127 when the drain is reverse biased relative to the gate (normal depletion mode JFET operation), the embodiment of FIG. 6 may be modified in the manner shown in FIG. 7. Here, the barrier regions contain thin walled oxide tubs 136, 137 filled with highly doped (e.g. N type material such as phosphorous) polycrystalline silicon regions 146, 147, which extend to surface 11 and may be biased independently to minimize the influence of the drain bias on the sidewalls of regions 161 adjacent barrier oxides 136 and 137. In addition, beneath barrier regions 126 and 127 respective impurity channel stopper regions 128 and 129 may be disposed. Again, because trench processing is used to form barrier regions 126 and 127, channel stopper regions 128 and 129 are readily self-aligned with regions 126 and 127 by introducing (e.g. implanting), prior to refill, regions 128 and 129 into the substrate beneath the bottoms of the trenches. These more heavily doped (p+ in the case of a PJFET) stopper regions minimize the influence of radiation-induced fixed oxide charge on the more lightly doped p channel 81; in the worst case they prevent inversion.

As will be appreciated from the foregoing description, the radiation insensitivity and breakdown voltage characteristics of a dual region top gate JFET are improved by configuring the dual top gate structure such that the entirety of the lower concentration region of the top gate is separated from the oxide/silicon interface by the high impurity concentration region, such that the entirety of the lower region of the top gate is spaced apart from the substrate/oxide interface by the top gate region. The implant dosage and energy of the lower region have a peak concentration that is less than or equal to the peak concentration of its adjacent channel. Also, the energy of the implant for the lower region is chosen to minimize the linear grading constant of the PN junction between that region and channel. The implant dosage and energy for the lower region simultaneously provides maximum breakdown voltage for the gate-channel junction and minimum variation in pinch-off voltage resulting from energy variations in the lower region and the adjacent channel. The surface concentration of the top surface region effectively maximizes hot electron immunity and radiation hardness within the constraint of the gate-drain breakdown voltage.

While I have shown and described several embodiments in accordance with the present invention, it is to be understood that the same is not limited thereto but is susceptible to numerous changes and modifications as known to a person skilled in the art, and I therefore do not wish to be limited to the details shown an described herein but intend to cover all such changes and modifications as are obvious to one of ordinary skill in the art.

What is claimed

1. A semiconductor device comprising:
   a semiconductor substrate of a first conductivity type having a first surface;
   first and second semiconductor regions of a second conductivity type, opposite to said first conductivity type, respectively disposed in first and second spaced-apart surface portions of said substrate;
   a third, channel, semiconductor region of said second conductivity type, disposed beneath a third surface portion of said substrate and bridging said first and second semiconductor regions; and
   a fourth, gate, semiconductor region of said first conductivity type extending from said third surface portion of said substrate, bridging said first and second semiconductor regions and so as to be contiguous with said third semiconductor region, said fourth region containing a fifth semiconductor region of a first impurity concentration, extending from said third surface portion of said substrate to a sixth semiconductor region of a second impurity concentration, lower than said first impurity concentration, said sixth region being contiguous with said third region and being spaced apart from said third surface portion of said substrate.

2. A semiconductor device according to claim 1, further comprising an insulator layer disposed on said third surface portion of said substrate.

3. A semiconductor device comprising:
a semiconductor substrate of a first conductivity type having a first surface;
first and second semiconductor regions of a second conductivity type, opposite to said first conductivity type, respectively disposed in first and second spaced-apart surface portions of said substrate;
a third, channel, semiconductor region of said second conductivity type, disposed beneath a third surface portion of said substrate and bridging said first and second semiconductor regions; and
a fourth surface gate region of said first conductivity type, extending from said third surface portion of said substrate, laterally between said first and second regions, so as to be contiguous with said channel region, said surface gate region including a fifth semiconductor region of a first impurity concentration extending from said third surface portion of said substrate to a sixth semiconductor region of a second impurity concentration, lower than said first impurity concentration, said sixth region being contiguous with said channel region, and wherein the entirety of said laterally extending sixth region is spaced apart from said first surface of said substrate.

4. A semiconductor device according to claim 3, further comprising a an insulator layer disposed on said third surface portion of said substrate.

5. A semiconductor region according to claim 3, wherein each of said fifth and sixth regions overlaps said first and second regions.

6. A semiconductor region according to claim 5, further including seventh and eighth semiconductor regions of said second conductivity type, respectively disposed in said first and second semiconductor regions, said seventh and eighth regions having an impurity concentration greater than that of said first and second regions.

7. A semiconductor region according to claim 6, wherein each of said fifth and sixth regions is separated from said seventh and eighth regions by semiconductor material of said first and second regions, respectively, therebetween.

8. A semiconductor region according to claim 7, wherein said fifth semiconductor region is spaced apart from said seventh and eighth regions by a distance greater than the separation between said sixth semiconductor region and said seventh and eighth regions.

9. A semiconductor region according to claim 3, further including first and second barrier regions, respectively separating said surface gate region from each of said first and second semiconductor regions.

10. A semiconductor region according to claim 9, wherein said barrier regions comprise insulation material.

11. A semiconductor region according to claim 9, wherein said barrier regions comprise insulation material and doped semiconductor material.

12. A semiconductor region according to claim 9, further including ninth and tenth semiconductor regions of said second conductivity type, disposed in said channel region adjacent to said first and second barrier regions, respectively, said ninth and tenth regions having an impurity concentration higher than that of said channel region.

13. A semiconductor region according to claim 12, wherein said barrier regions comprise insulation material surrounding doped semiconductor material of said first conductivity type.

14. A semiconductor region according to claim 3, further including first and second barrier regions, respectively extending from said first surface of said substrate to said channel region and laterally separating said surface gate region from each of said first and second semiconductor regions.

15. A semiconductor region according to claim 14, wherein each of said first and second barrier regions is comprised of dielectric material.

16. A semiconductor region according to claim 15, further including ninth and tenth semiconductor regions of said second conductivity type, disposed in said channel region adjacent to said first and second barrier regions, respectively, said ninth and tenth regions having an impurity concentration higher than that of said channel region.

17. A semiconductor region according to claim 14, wherein said barrier regions comprise insulation material surrounding doped semiconductor material of said first conductivity type.

* * * * *